United States Patent [19]

Blum

[11] Patent Number: 5,757,218

[45] Date of Patent: May 26, 1998

[54] CLOCK SIGNAL DUTY CYCLE CORRECTION CIRCUIT AND METHOD

[75] Inventor: David W. Blum, Essex Junction, Vt.

[73] Assignee: International Business Machines Corporation, Armonk, N.Y.

[21] Appl. No.: 614,458

[22] Filed: Mar. 12, 1996

[51] Int. Cl.⁶ .................................................. H03K 3/017
[52] U.S. Cl. .................................................. 327/175; 327/172
[58] Field of Search .............................. 327/124, 155, 327/161, 172, 173, 174, 175, 176

[56] References Cited

U.S. PATENT DOCUMENTS

| | | | |
|---|---|---|---|
| 4,077,010 | 2/1978 | Ryon | 328/20 |
| 4,141,033 | 2/1979 | de Boer | 358/7 |
| 4,596,954 | 6/1986 | Haque | 328/20 |
| 4,797,585 | 1/1989 | Segawa et al. | 327/172 |
| 4,799,022 | 1/1989 | Skierszkan | 328/20 |
| 5,118,975 | 6/1992 | Hillis et al. | 307/602 |
| 5,347,232 | 9/1994 | Nishimichi | 331/1 A |

OTHER PUBLICATIONS

Bechade, R. A. and Houle, R. M., "Digital delay line clock shapers and multipliers".*IB M J. Res. Develop.*, vol. 39, No. 1/2, Jan./Mar. 1995, pp. 93–103.

*Primary Examiner*—Timothy P. Callahan
*Assistant Examiner*—Jeffrey Zweizig
*Attorney, Agent, or Firm*—Schmeiser, Olsen & Watts; Robert A. Walsh

[57] ABSTRACT

A duty cycle correction circuit that facilitates correction of clock signal duty cycles, including correcting for errors introduced by intervening devices in the clock signal distribution network. The duty cycle correction circuit of the preferred embodiment comprises a clock chopper circuit, a duty cycle comparator circuit, and a control circuit. The duty cycle comparator circuit compares the duty cycle of the clock signal with the duty cycle of a reference signal. The control circuit adjusts the clock chopper circuit based upon the duty cycle comparison, resulting in an output with a corrected duty cycle.

20 Claims, 5 Drawing Sheets

CLOCK SIGNAL DUTY CYCLE CORRECTION CIRCUIT AND METHOD

BACKGROUND OF THE INVENTION

1. Technical Field

This invention generally relates to clock signal generation, and more specifically relates to improving the accuracy of the duty cycle of a clock signal.

2. Background Art

In digital clock applications it is desirable that the clock duty cycle be accurately controlled. The duty cycle of a digital clock signal is generally stated as a percentage. For example, a clock signal that has a pattern of 80% low and 20% high is a 80/20 duty cycle. Generally, it is desirable that the duty cycle of a clock signal be a pure 50% cycle, where a pure 50% duty cycle has a waveform with equal high and low portions. Unfortunately, many types of circuits create duty cycle distortion, and it is difficult to maintain a pure 50% duty cycle using traditional methods.

Known methods for duty cycle correction use either an analog or digital phase-locked loop (PLL) or a delay-line-loop (DLL) to double the input clock frequency, and then use an output-frequency-divide-by-two circuit to return to the input frequency with a corrected duty cycle. These methods are primarily used to control the phase and frequency of the output signal, and only indirectly and partially control the duty cycle of the output signal.

Unfortunately, both the use of PLL's and DLL's for duty cycle correction have numerous disadvantages. First, in the case of the PLL, the area needed for the capacitors in the loop filter is relatively high. Second, in the case of the DLL, the required length of the delay line is excessive, thus requiring an excessive number of delay elements. Both of these disadvantages result in excessive space on the semiconductor device being used.

Additionally, because a DLL duty correction circuit uses a long delay line (with a high number of inverters), the power dissipated by the delay line is also excessive.

Additionally, neither the PLL nor DLL design corrects the duty cycle at the output of the intervening circuits such as a clock distribution tree buffer or an off-chip driver. Since the output of these intervening circuits are not corrected by the PLL or DLL designs, the PLL and DLL do not provide optimal duty cycle correction.

For example, "Digital Delay Line Clock Shapers and Multipliers," by R. A. Bechade and R. M. Houle, IBM J. RES. DEVELOP., Vol. 39, No. ½, Jan/March 1995 p. 93–103, discloses a digital method for shaping and duty cycle correction, and is incorporated herein by reference. However, this disclosed method does not facilitate the compensation of duty cycle error introduced by intervening circuits.

Therefore, there existed a need to provide an improved circuit for correcting a clock signal duty cycle, with a minimal amount of circuitry required, reducing the space used on the device. Also, a need existed to provide a duty cycle correction circuit that minimizes the power consumed. Additionally, a need existed to provide a circuit with direct duty cycle control as its primary function. Additionally, a need existed for a circuit that corrects the duty cycle and compensates for error introduced by intervening circuits, such as an output driver.

DISCLOSURE OF INVENTION

According to the present invention, a duty cycle correction circuit and method is provided that facilitates the correction of clock signal duty cycles, including the correction of errors introduced by intervening devices in the clock signal distribution network. The duty cycle correction circuit of the present invention comprises a clock chopper circuit, a duty cycle comparator circuit, and a control means. The duty cycle comparator circuit compares the duty cycle of the clock signal with the duty cycle of a reference signal. The control means adjusts the clock chopper circuit based upon the duty cycle comparison, resulting in an output with a corrected-duty cycle.

The method for correcting the duty cycle of a clock signal includes the steps of: chopping the clock signal, thereby creating a corrected clock signal with a duty cycle adaptively determined by said chopping of said clock signal; comparing the corrected clock signal with a duty cycle reference signal; and adjusting the chopping of said clock signal according to said comparison of said corrected clock signal with a duty cycle reference signal.

The foregoing and other features and advantages of the claimed invention will be apparent from the following more particular description of preferred embodiments of the invention, as illustrated in the accompanying drawings.

BRIEF DESCRIPTION OF DRAWINGS

The preferred exemplary embodiment of the present invention will hereinafter be described in conjunction with the appended drawings, where like designations denote like elements, and.

BEST MODE FOR CARRYING OUT THE INVENTION

An improved duty cycle correction circuit is provided that corrects a clock signal duty cycle, with a minimal amount of circuitry required, reducing the space used on the device. The disclosed duty cycle correction circuit provides duty cycle correction with minimum power consumption. Additionally, the disclosed duty cycle correction circuit provides a circuit with direct duty cycle control as its primary function. Additionally, the disclosed duty correction circuit corrects the duty cycle and compensates for error introduced by intervening circuits, such as an output driver.

Figure 1:
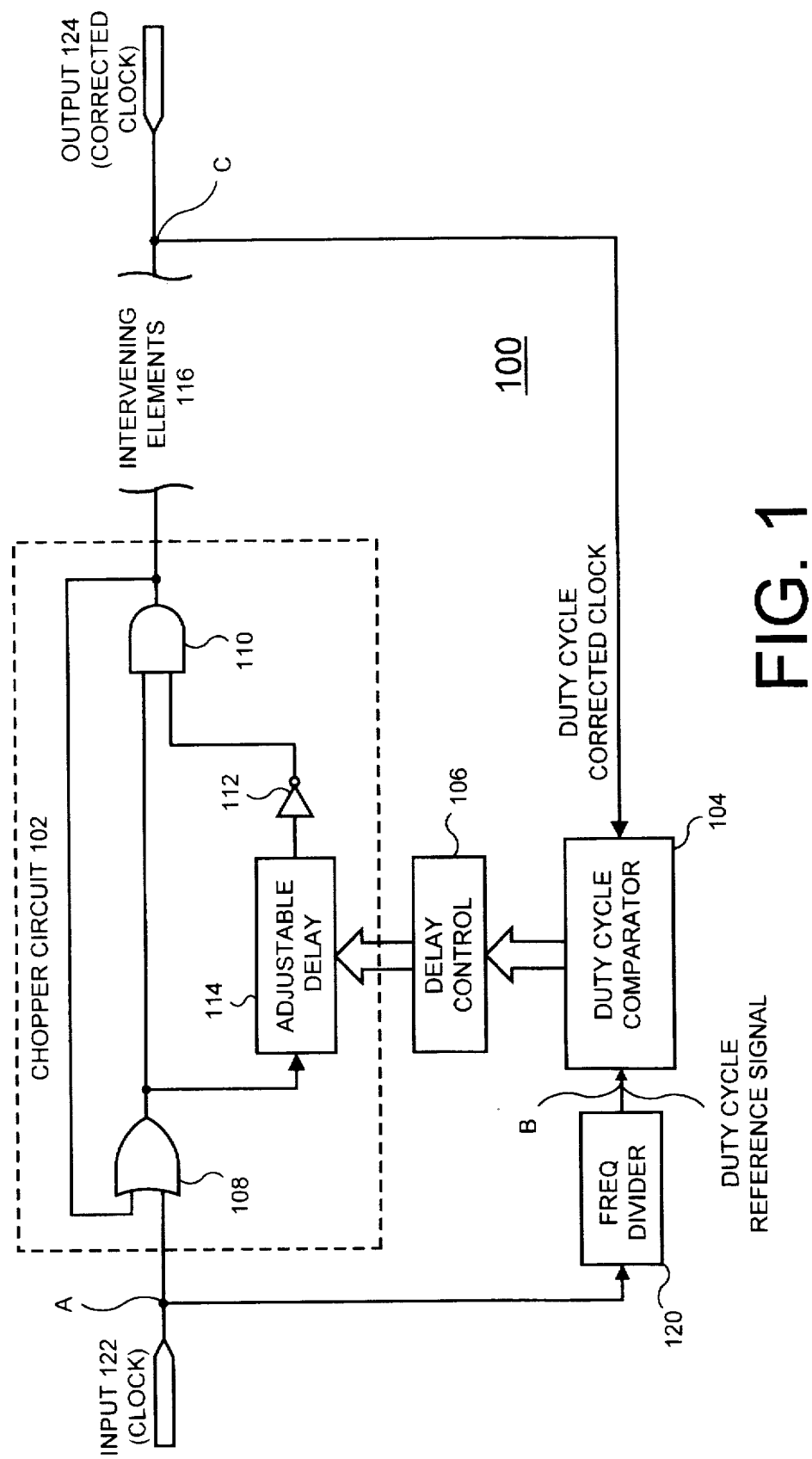
FIG. 1 is a schematic view of a duty cycle correction circuit in accordance with a preferred embodiment of the present invention.

Turning now to FIG. 1, FIG. 1 is a schematic view of a duty cycle correction circuit 100 in accordance with the present invention. Duty cycle correction circuit 100 will typically be part of a larger semiconductor device, the larger device using a digital clock signal. Duty cycle correction circuit 100 includes a chopper circuit 102, a duty cycle comparator 104, a delay control circuit 106, and a frequency divider 120.

One specific implementation of chopper circuit 102 includes an OR logic gate 108, an AND logic gate 110, an inverter 112, and an adjustable delay 114. Chopper circuit 102 operates on an input clock signal from input 122. The input clock signal is additionally fed to frequency divider 120. A typical clock signal with a distorted duty cycle, as found at point A of FIG. 1, is illustrated as waveform 502 of FIG. 5. Usually, the input clock signal will be the system clock for the entire semiconductor device, the clock source for the device. The input clock signal is typically from an off-chip source, and is received by a receiver circuit for use on the semiconductor device. However, the duty cycle of the input clock signal is heavily distorted by the receiver circuit of the semiconductor device. Additionally, noise on the device can further distort the duty cycle. Ideally, the duty cycle of the clock signal should be 50%.

The operation of chopper circuit 102 is generally as follows. When a high portion of a clock pulse as part of the input clock signal 122 enters the chopper, the output of AND gate 110 will go high. The output of AND gate 110 will stay high until the leading edge of the clock propagates through adjustable delay 114 and inverter 112. At that tine, the output of AND gate 110 goes low. Thus, the width of the output pulse of AND gate 110 (and hence chopper circuit 102's output) is dependent upon the delay through adjustable delay 114. This allows chopper circuit 102 to adjust the duty cycle of its output by varying the delay through adjustable delay 114.

In operation, chopper circuit 102 outputs a square wave with a duty cycle equal to the delay through adjustable delay 114 and inverter gate 112. When the delay of adjustable delay 114 is properly determined, the output of chopper circuit 102 will constitute a duty cycle corrected clock signal, having a pure 50% duty cycle at output 124. This duty cycle corrected clock signal travels through several intervening elements 116 before being outputted (typically to off-chip devices) as a clock signal at output 124. The duty cycle corrected clock signal is also fed back to duty cycle comparator 104 after intervening elements 116. In operation, the duty cycle corrected clock signal will have a pure 50% duty cycle at output 124, its duty cycle having been corrected for errors existing at the input and errors introduced by intervening elements 116.

Intervening elements 116 can constitute any element that may introduce duty cycle error to the clock signal. Thus, intervening elements 116 can constitute a clock tree distribution network, buffer circuits, and/or an off-chip driver used to drive signals off chip. Intervening elements 116 each introduce duty cycle error to the clock signal. Because of this, in the preferred embodiment, the duty cycle corrected clock signal is fed back after the intervening elements 116, but before the signal is taken off-chip, to facilitate compensation for the duty cycle error introduced by those elements. In prior methods of duty cycle correction the error introduced by these intervening elements 116 could not be effectively compensated for.

The duty cycle corrected clock signal is compared to a duty cycle reference signal by duty cycle comparator 104. The duty cycle reference signal is created by inputting the input clock signal from input 122 into frequency divider 120. As is inherent in the use of divide-by-two frequency dividers, the output of frequency divider 120 is a square wave with a pure 50% duty cycle and one-half the frequency of the input clock signal. Of course a frequency divider that outputs other frequencies, such as one-fourth the input clock signal can also be used. A typical duty cycle reference signal, as found at point B of FIG. 1, with a pure 50% duty cycle and one-half the frequency of the input clock signal, is illustrated as waveform 504 of FIG. 5. The output of frequency divider 120 serves as the duty cycle reference signal.

The duty cycle corrected clock signal at output 124 is fed back and compared to the duty cycle reference signal by duty cycle comparator 104. The feedback point is preferably after intervening elements 116, and thus the comparison can account for distortions caused by intervening elements 116. The operation of duty cycle comparator 104 will be disclosed in greater detail with reference to FIG. 2. Duty cycle comparator 104 outputs an increment and a decrement delay signal to delay control 106 based upon the duty cycle comparison performed by comparator 104. The operation of delay control 106 will be disclosed in greater detail with reference to FIG. 2. Delay control 106 outputs a delay control signal to adjustable delay 114 of chopper circuit 102. The delay of adjustable delay 114 is determined by the delay control signal. Thus, the chopper circuit, in particular, the duty cycle of the output of the chopper circuit is controlled, and adaptively corrected such that the duty cycle of the output clock signal at the feedback point, output 124, is 50%. This provides a clock signal with a corrected duty cycle for use in the semiconductor device. A typical corrected clock signal, as found at point C of FIG. 1, is illustrated as waveform 506 of FIG. 5. The corrected clock signal has the same frequency as the input clock signal, but with a corrected duty cycle.

Figure 2:
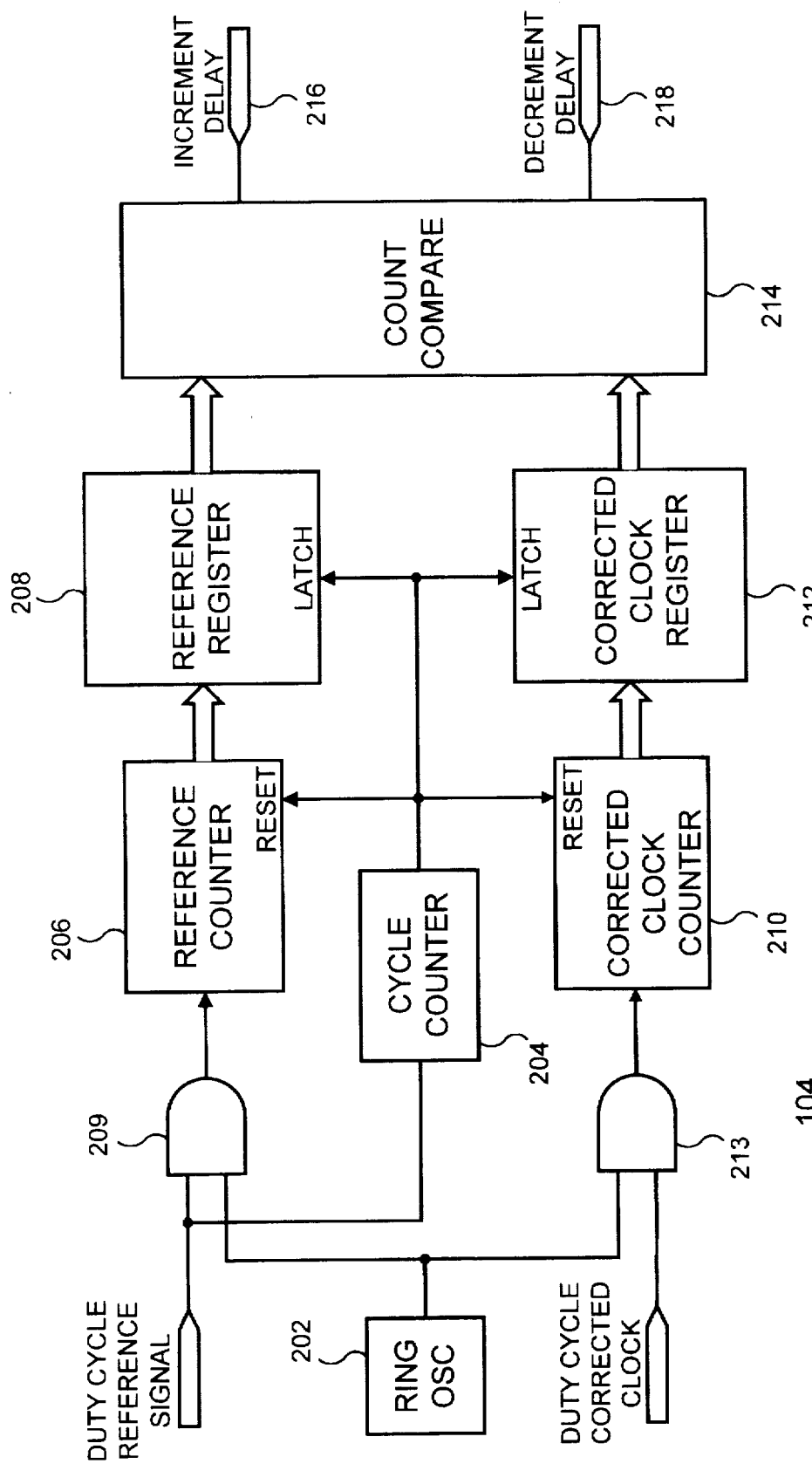
FIG. 2 is a schematic view of the duty cycle comparator circuit of FIG. 1.

Turning now to FIG. 2, FIG. 2 is a schematic view of the duty cycle comparator 104 of FIG. 1 in accordance with the preferred embodiment of the present invention. Duty cycle comparator 104 comprises a ring oscillator 202, a cycle counter 204, a reference counter 206, a reference register 208, a reference AND gate 209, a corrected clock counter 210, a corrected clock register 212, a corrected clock AND gate 213, and a count compare device 214.

Duty cycle comparator 104 receives as an input the duty cycle corrected clock signal and the duty cycle reference signal as illustrated in FIG. 1. The reference signal is ANDed with an output from ring oscillator 202 by AND gate 209. Likewise, the corrected clock signal is ANDed with the output from ring oscillator 202 by AND gate 213. Ring oscillator 202 is selected to output a square wave. The frequency of ring oscillator 202's output is suitably greater than 5 times the corrected clock signal frequency and preferably greater than 10 times the corrected clock signal frequency. A suitable ring oscillator 202 output is illustrated as waveform 508 of FIG. 5.

With inputs from ring oscillator 202 and the reference clock signal, the output of reference AND gate 209 is a series of pulses proportional to the duty cycle of the reference signal. A typical output of reference AND gate 209 is illustrated as waveform 510 of FIG. 5. Likewise, the output of corrected clock AND gate 213 is a series of pulses proportional to the duty cycle of the corrected clock signal. A typical output of corrected clock AND gate 213 is illustrated as waveform 512 of FIG. 5. The two outputs of AND gates 209 and 213 facilitate the comparison of the duty cycles of the respective signals, without regard to the difference in frequency between the corrected clock signal and the duty cycle reference signal.

The output of reference AND gate 209 is connected to reference counter 206. Likewise, the output of corrected clock AND gate 213 is connected to corrected clock counter 210. The respective counters 206 and 210 each count and output the number of pulses received at their input. The counters are reset to zero by a signal to their reset input. In a preferred embodiment, the counters 206 and 210 each output a binary number equal to the number of pulses. Because the number of pulses is proportional to the duty cycle of the inputted signal, the binary output of counters 206 and 210 are each proportional to the duty cycle of their respective signals.

The outputs of reference counter 206 and corrected clock counter 210 are connected to the inputs of reference register 208 and corrected clock register 212 respectively. Each register latches the output of its respective counter when the latch signal is enabled.

In a preferred embodiment, the latch inputs of registers 208 and 212 and the reset inputs of counters 206 and 210 are all controlled by cycle counter 204. Cycle counter 204 inputs the duty cycle reference signal. The outputs of cycle counter 204 are connected to the reset inputs of counters 206 and 210 and the latch inputs of registers 208 and 212. Thus, when the output of cycle counter 204 is enabled, registers 208 and 212 will latch the current output of counters 206 and 208 and then counters 206 and 208 will be reset.

Figure 5:
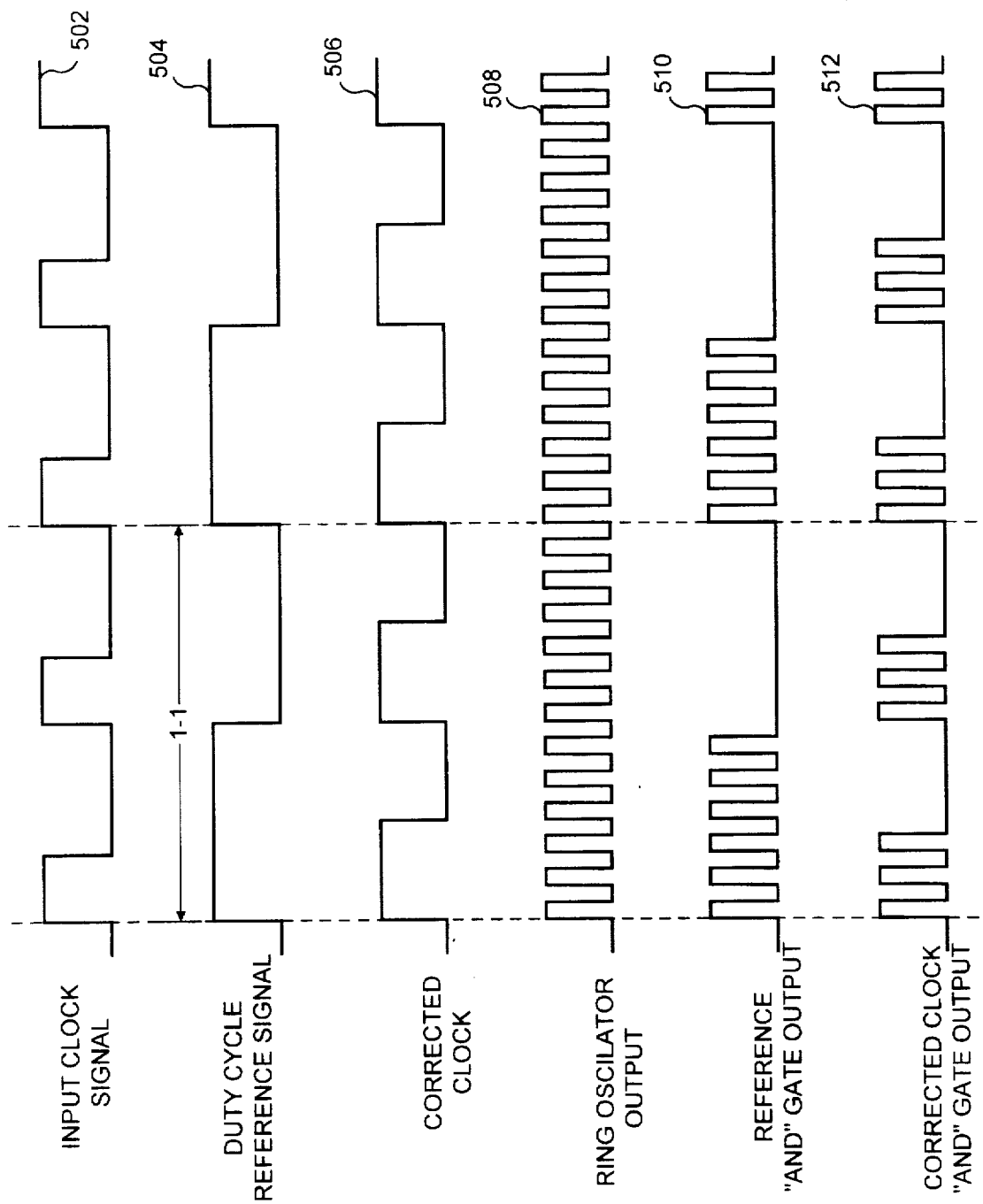
FIG. 5 is a timing diagram illustrating various representative waveforms of the circuit of FIG. 1.

Cycle counter 204 preferably is selected to enable an output on an integer number of duty cycle reference signal cycles. Thus, on an integer number of duty cycle reference signal cycles registers 208 and 212 will latch and counters 206 and 210 will be reset. Line 1—1 of FIG. 5 illustrates an integer number of duty cycle reference signals of waveform 504, where the integer number is one. In a preferred embodiment, the integer number would suitably be at least one and preferably at least four. Typically, the integer number chosen would be dependent upon the stability of the loop, the ring oscillator frequency, and the clock frequency.

Particularly, with the output of cycle counter 204 connected to the reset input of reference counter 206 and corrected clock counter 210 each counter will count the number of pulses outputted by reference AND gate 209 and corrected clock AND gate 213, respectively, during an integer number of reference signal cycles. As illustrated in FIG. 5, over the integer number of reference duty cycles the reference AND gate outputs a number of pulses in proportion to its pure 50% duty cycle. Likewise, the corrected clock AND gate outputs a number of pulses in proportion to its duty cycle. Using these two series of pulses the duty cycles of the respective signals can be compared irrespective of their different frequencies. Thus, counting the number of pulses between integer number of reference signal cycles assures that the counting will be done over complete cycles of both the reference signal and the corrected clock signals, and that each count will be proportional to the respective duty cycles. Obviously, the higher integer number of reference signal cycles, the greater the accuracy of the correction due to time-averaging. However, the benefits of time-averaging must be weighed against slower response times to arrive at an optimal solution.

With the output of cycle counter 204 also connected to the latch inputs of registers 208 and 212, the registers will latch the output of counters 206 and 210 before they are reset. So latched, the output of the registers will be proportional to the duty cycle of their respective input signals. The output of the registers will be latched until the next signal from cycle counter 204 relatches the register with the new counter output.

The output of reference register 208 and corrected clock register 212 are each connected to count compare 214. Count compare 214 compares the duty cycle of the reference signal with the duty cycle of the corrected clock signal by comparing the output of reference register 208 with the output of corrected clock register 212. When the output of the reference register 208 is greater than the output of the corrected clock register 212, the duty cycle of corrected clock signal is less than 50% and the count compare 214 will output a signal to increment delay output 216. Conversely, when the output of the reference register 208 is less than the output of the corrected clock register 212, the duty cycle is greater than 50%, and the count compare 214 will output a signal to decrement delay output 218. The increment delay output 216 and decrement delay output 218 are each connected to delay control 106 of FIG. 1. In turn, delay control 106 controls the duty cycle of the output of chopper circuit 102 by controlling the delay through adjustable delay 114. Thus, the duty cycle of the clock signal at output 124 is adaptively controlled based upon the comparison made by duty cycle comparator 104.

Figure 3:
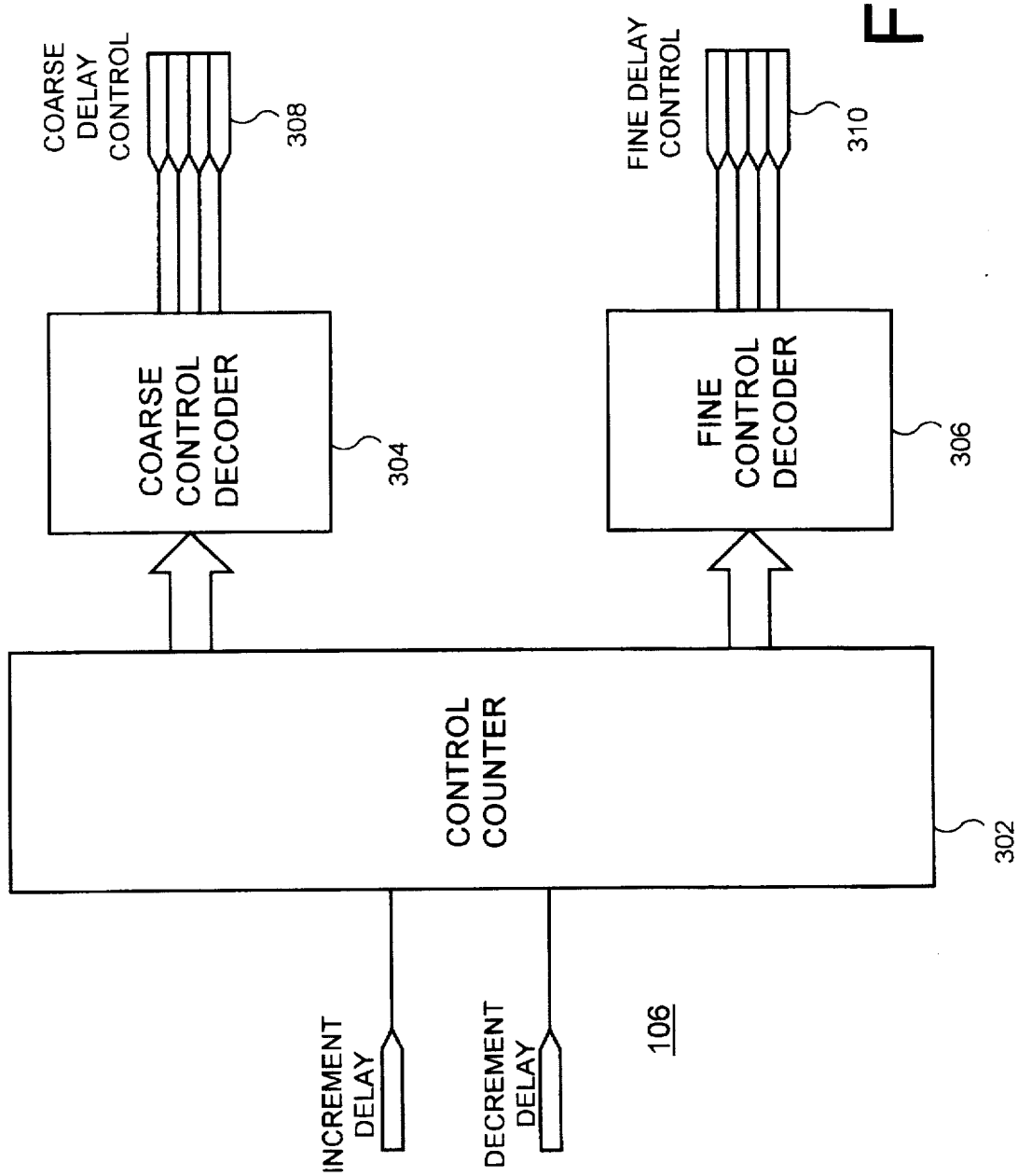
FIG. 3 is schematic view of the delay control circuit of FIG. 1.

Turning now to FIG. 3, FIG. 3 is a schematic view of a delay control circuit 106 in accordance with the present invention. The delay control circuit 106 inputs the increment delay signal and the decrement delay signal from duty cycle comparator 104 of FIG. 1. Delay control circuit 106 comprises a control counter 302, a coarse control decoder 304, a fine control decoder 306, a coarse delay control output 308, and a fine delay control output 310.

Control counter 302 receives increment and decrement delay signals from count compare 214 of FIG. 2. Control counter 302 counts the increment and decrement delay signals, and outputs control signals that adaptively respond to the increment and decrement delay inputs. The control signals are connected to coarse control decoder 304 and fine control decoder 306. The output of control counter 302 is decoded by coarse control decoder 304 and fine control decoder 306. Coarse control decoder 304 outputs a plurality of coarse delay control signals to output 308. Likewise, fine control decoder 306 outputs a plurality of fine delay control signals to output 310. The delay control signals are used to control adjustable delay 114 of FIG. 1. By controlling the delay of adjustable delay 114, the control signals 308 and 310 control the duty cycle at output 124 of FIG. 1.

Figure 4:
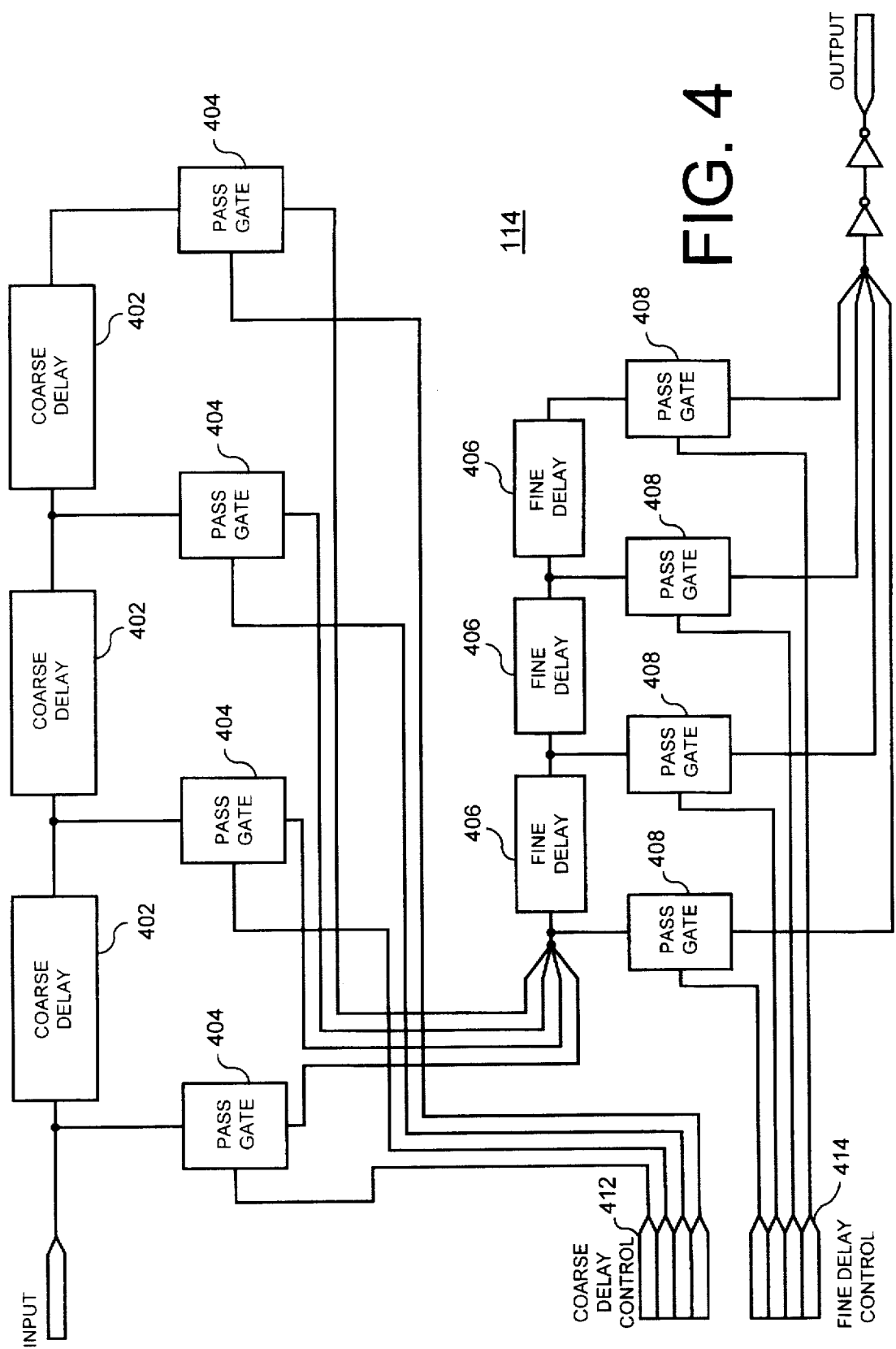
FIG. 4 is a schematic view of the adjustable delay circuit of FIG. 1.

Turning now to FIG. 4, FIG. 4 is a schematic view of an adjustable delay circuit 114 in accordance with the present invention. Adjustable delay 114 comprises a plurality of coarse delay elements 402, a plurality of coarse delay pass gates 404, a plurality of fine delay elements 406, and a plurality of fine delay pass gates 408. In a preferred embodiment, each coarse delay element 402 will have a delay approximately four times that of each fine delay element 406.

The path of a signal traveling through from the input of adjustable delay circuit 114 to the output is controlled by the plurality of pass gates 404 and 408. Each of pass gates 404 and 408 comprise a signal input, a signal output and a control input. Each pass gate 404 and 408 couples the signal on its signal input to its signal output when its control input is in a first predetermined (i.e., active) state, and provides a high impedance on its signal output when its control is in a second predetermined (i.e., inactive) state. The operation of pass gates 404 and 408 are controlled by coarse delay control input 412 and fine delay control input 414 respectively. Normally, only one of the plurality of coarse delay pass gates 404 and only one of the plurality of fine delay pass gates 408 would be active at a time. The signal path flows through the active pass gates, with the pass gates determining which of the coarse delay elements 402 and fine delay elements 404 are in the signal path. Thus, the delay from the input to the output of adjustable delay 114 is controlled by the coarse delay control input 412 and fine delay control input 414.

The delay from the input to the output of adjustable delay 114 can be increased by fine increments by de-activating a fine pass gate 408 and activating another fine pass gate 408 such that the signal path flows through additional fine delay elements 406. When the delay can no longer be increased by adding another fine delay element 406 to the signal path, the delay is increased by closing a coarse pass gate 404 and opening another coarse pass gate 404 such that the signal path flows through additional coarse delay elements. At the same time, a fine pass gate is closed and the first fine pass gate is opened, removing the fine delay elements 406 from the delay path. This has the effect if increasing the delay by approximately a fine increment.

By selectively opening pass gates 404 and 406 in this fashion, the delay of adjustable delay 114 can be adjusted from almost not including any delays to including all of coarse delay elements 402 and fine delay elements 404. The total range of adjustable delay 114 is suitably selected to assure duty cycle correction at the frequency of interest.

While the invention has been particularly shown and described with reference to preferred exemplary embodiments thereof, it will be understood by those skilled in the art that the foregoing and other changes in form and details may be made therein without departing from the spirit and scope of the invention. For example, the adjustable delay 104 of FIG. 4 could be replaced with other well known types of adjustable delays. As another example, the chopper circuit 102 of FIG. 1 could be replaced with other well known chopper circuits. It will be understood that, while various of the connections are shown in the drawing as single lines, they are not so shown in a limiting sense, and may comprise plural connections, as is understood in the art.

I claim:

1. A duty cycle correction circuit for correcting the duty cycle of a clock signal, said duty cycle correction circuit comprising:
    (a) a clock chopper circuit, said clock chopper circuit including an adjustable delay circuit, wherein said clock chopper circuit having as an input said clock signal and as an output a duty cycle corrected clock signal;
    (b) a duty cycle comparator circuit, wherein said duty cycle comparator circuit compares a duty cycle reference signal with said duty cycle corrected clock signal and provides a comparator output;
    (c) a control circuit, wherein said control circuit controls said adjustable delay circuit according to said comparator output of said duty cycle comparator circuit.

2. The duty cycle correction circuit of claim 1 wherein said duty cycle comparator circuit compares said duty cycle corrected clock signal after said duty cycle corrected clock signal has passed through at least one intervening circuit element.

3. The duty cycle correction circuit of claim 2 wherein said intervening circuit element comprises an off-chip driver.

4. The duty cycle correction circuit of claim 2 wherein said intervening circuit element comprises a clock tree.

5. The duty cycle correction circuit of claim 1 wherein said duty cycle reference signal is created by frequency dividing said clock signal.

6. The duty cycle correction circuit of claim 1 wherein said duty cycle comparator circuit comprises a duty cycle reference counter and a duty cycle corrected clock counter.

7. The duty cycle correction circuit of claim 6 wherein said duty cycle reference counter and said duty cycle corrected clock counter each count over an integer number of said duty cycle reference signal cycles.

8. The duty cycle correction circuit of claim 1 wherein said duty cycle comparator circuit comprises a ring oscillator, said ring oscillator having an output with a frequency at least five times the frequency of said clock signal.

9. The duty cycle correction circuit of claim 1 wherein said duty cycle comparator comprises a ring oscillator, a duty cycle reference counter, a corrected clock counter, wherein said duty cycle reference counter counts pulses of said duty cycle reference signal ANDed with said ring oscillator output and wherein said corrected clock counter counts pulses of said corrected clock signal ANDed with said ring oscillator.

10. The duty cycle correction circuit of claim 1 wherein said control circuit inputs an increment delay and a decrement delay signal and outputs a plurality of delay control signals.

11. The duty cycle correction circuit of claim 1 wherein said adjustable delay circuit comprises a plurality of coarse delay elements and a plurality of fine delay elements.

12. A duty cycle correction circuit for correcting the duty cycle of a clock signal, said duty cycle correction circuit comprising:
    (a) a clock chopper circuit, said clock chopper circuit including an adjustable delay circuit and having as an input said clock signal and outputting a duty cycle corrected clock signal;
    (b) a duty cycle comparator circuit, wherein said duty cycle comparator circuit is adapted to compare a duty cycle corrected clock signal from a feedback point coupled to said clock chopper circuit with a duty cycle reference signal, wherein said duty cycle reference signal is derived by dividing said clock signal, and wherein said duty cycle comparator circuit further comprises a comparator output;
    (c) a control circuit, wherein said control circuit is adapted to adjust said adjustable delay circuit according to said comparator output of said duty cycle comparator circuit, wherein said clock chopper circuit is adaptively controlled by said duty cycle comparator circuit such that said duty cycle corrected clock signal has a desired duty cycle at said feedback point.

13. The duty cycle correction circuit of claim 12 further comprising at least one intervening circuit element coupled between said clock chopper circuit and said feedback point.

14. The duty cycle correction circuit of claim 12 wherein said duty cycle comparator comprises a ring oscillator, a duty cycle reference counter, a corrected clock counter, wherein said duty cycle reference counter counts pulses of said duty cycle reference signal ANDed with said ring oscillator output and wherein said corrected clock counter counts pulses of said corrected clock signal ANDed with said ring oscillator.

15. A method for correcting the duty cycle of a clock signal, said method comprising the steps of:
    (a) chopping said clock signal, said chopping creating a corrected clock signal with a duty cycle adaptively determined by said chopping of said clock signal;
    (b) comparing said corrected clock signal with a duty cycle reference signal;
    (c) adjusting said chopping of said clock signal according to said comparison of said corrected clock signal with said duty cycle reference signal.

16. The method of claim 15 wherein the step of comparing said corrected clock signal with said duty cycle reference signal comprises feeding back said corrected clock signal from a feedback point after the corrected clock signal passes through at least one intervening circuit.

17. The method of claim 15 wherein the step of comparing said corrected clock signal with said duty cycle reference signal comprises combining said corrected clock and said duty cycle reference signal with a high frequency clock signal, said combining creating a first series of signals in proportion to the duty cycle of said corrected clock signal and creating a second series of signals in proportion to the duty cycle of said duty cycle reference signal.

18. The method of claim 17 wherein the step of comparing said corrected clock signal with said duty cycle reference signal additionally comprises counting said first and second series of signals over an integer number of duty cycle reference signal cycles.

19. The method of claim 18 wherein said integer number is at least four.

20. A method for correcting the duty cycle of a clock signal, said method comprising the steps of:

(a) chopping said clock signal, said clock chopping including adjusting a delay circuit and outputting a duty cycle corrected clock signal;

(b) comparing said duty cycle corrected clock signal from a feedback point after said clock chopping with a duty cycle reference signal, wherein said duty cycle reference signal is derived by dividing said clock signal, and outputting a comparator output; and (c) adjusting delay of said clock chopping according to said comparator output wherein said clock chopping is adaptively controlled by said comparator output such that said duty cycle corrected clock signal has a desired duty cycle at said feedback point.

* * * * *